US010032951B2

(12) United States Patent
Seitz

(10) Patent No.: US 10,032,951 B2
(45) Date of Patent: Jul. 24, 2018

(54) SEMICONDUCTOR PHOTOSENSOR FOR INFRARED RADIATION

(71) Applicant: HAMAMATSU PHOTONICS K.K., Hammamatsu-shi, Shizuoka (JP)

(72) Inventor: Peter Seitz, Urdorf (CH)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/432,886

(22) PCT Filed: Mar. 31, 2014

(86) PCT No.: PCT/JP2014/060042
§ 371 (c)(1),
(2) Date: Apr. 1, 2015

(87) PCT Pub. No.: WO2014/163205
PCT Pub. Date: Oct. 9, 2014

(65) Prior Publication Data
US 2015/0280047 A1 Oct. 1, 2015

(30) Foreign Application Priority Data
Apr. 4, 2013 (CH) .......................... 716/13

(51) Int. Cl.
*G01J 5/20* (2006.01)
*H01L 31/113* (2006.01)
(Continued)

(52) U.S. Cl.
CPC ............ *H01L 31/1136* (2013.01); *G01J 5/24* (2013.01); *H01L 27/14649* (2013.01);
(Continued)

(58) Field of Classification Search
CPC ... H01L 31/1136; H01L 27/14649; G01J 5/24
(Continued)

(56) References Cited

U.S. PATENT DOCUMENTS 6,420,707 B1  7/2002 Anthony et al.
6,480,641 B1 * 11/2002 Ding .................. G02F 1/218
                                               359/248
(Continued)

FOREIGN PATENT DOCUMENTS

EP    2 160 012 B1   11/2013
JP    H03-88367 A     4/1991
(Continued)

OTHER PUBLICATIONS

Dziewior et al., "Minority-carrier diffusion coefficients in high doped silicon", Appl. Phys. Lett. 35(2), Jul. 15, 1979.*
(Continued)

*Primary Examiner* — David Porta
*Assistant Examiner* — Abra Fein
(74) *Attorney, Agent, or Firm* — Drinker Biddle & Reath LLP

(57) ABSTRACT

A photosensor for the detection of infrared radiation in the wavelength range of 1 to 1000 micrometers consists of a semiconductor substrate with a highly doped interaction volume for the incoming radiation. At the edge of this highly doped region, an extended gate electrode is placed consisting of a conducting material on top of an insulating layer. On the other side of the gate electrode, another highly doped semiconductor region is placed, acting as a charge collector. Through free carrier absorption in the interaction volume, incoming photons impart their energy on mobile charge carriers. In the case of free electrons, the gate electrode is biased slightly below the reset voltage of the interaction volume, so that the electrons carrying the additional energy of the absorbed photons can predominantly make the transition from the interaction volume across the gate electrode area to the charge collector volume.

12 Claims, 10 Drawing Sheets

(51) Int. Cl.
*H01L 31/02* (2006.01)
*H01L 31/103* (2006.01)
*H01L 27/146* (2006.01)
*G01J 5/24* (2006.01)
*G01J 1/46* (2006.01)

(52) U.S. Cl.
CPC ...... *H01L 31/02019* (2013.01); *H01L 31/103* (2013.01); *H01L 31/1037* (2013.01); *G01J 1/46* (2013.01)

(58) Field of Classification Search
USPC ....................................................... 250/338.4
See application file for complete search history.

(56) References Cited

U.S. PATENT DOCUMENTS

| | | | |
|---|---|---|---|
| 6,493,030 B1 | 12/2002 | Kozlowski et al. | |
| 7,214,269 B2* | 5/2007 | Wachi | C30B 11/00 117/81 |
| 8,119,972 B2 | 2/2012 | Lotto et al. | |
| 8,138,822 B1* | 3/2012 | Cyrusian | G05F 1/561 327/157 |
| 2004/0174449 A1* | 9/2004 | Lee | H04N 5/3597 348/308 |
| 2011/0133060 A1 | 6/2011 | Yu et al. | |

FOREIGN PATENT DOCUMENTS

| | | |
|---|---|---|
| JP | H02-248077 A | 10/1992 |
| JP | 2001-504274 A | 3/2001 |

OTHER PUBLICATIONS

Z Bielecki, "Readout electronics for optical detectors", Optoelectronics Review, vol. 12, No. 1, 2004, p. 129-p. 137.
Jacob Fraden, "Handbook of Modern Sensors (3rd Edition)", Springer, 2004.
A.G.U. Perera et al., "Homojunction interal photoemission farinfrared detectors: Photoresponse performance analysis", J. Appl. Phys., 1995, vol. 77, p. 915-p. 924.
htttps://en.wikipedia.org/wiki/Particle_in_a_box.
Wheeler et al., "A Novel Voltage Tuneable Infrared Spectrometer-Dectector," IEEE Transactions on Electron Devices, vol. ED-22, No. 11, pp. 1001-1009, 1975.
Aw et al., "Optical absorption measurements of band-gap shrinkage in moderately and heavily doped silicon," J. Phys.: Condens. Matter 3, pp. 8213-8223, 1991.
Saleh et al., "Fundamentals of Photonics," John Wiley and Sons, Inc., 2nd Edition, 2007.

* cited by examiner

SEMICONDUCTOR PHOTOSENSOR FOR INFRARED RADIATION

TECHNICAL FIELD

The present invention relates to a method and a device for the detection of infrared radiation in the wavelength range of 1 to 1000 micrometers, making use of known semiconductor manufacturing processes. In particular, the invention relates to an infrared photosensor that can be manufactured with silicon processes such as the ones widely used for silicon-based CMOS (Complementary Metal Oxide Semiconductor) devices.

BACKGROUND ART

The detection of electromagnetic radiation is one of the most important sensing tasks in science, technology and consumer electronics. Silicon is the fundamental semiconductor of microelectronics, and it is very well suited for the fabrication of highly sensitive photosensors—from point detectors to multi-megapixel image sensors—covering the wide spectral domain from the soft X-ray region to the near infrared. This corresponds to a sensitive wavelength range from about 1 nm up to the cutoff-wavelength of silicon of about 1100 nm. Due to the growing importance of infrared radiation for diagnostic and non-contact chemical fingerprinting purposes, there is also a rapidly growing need for photosensors that are sensitive in the infrared spectral domain with a wavelength above 1 micrometer, where conventional silicon photosensors are not sensitive anymore.

A widely-used method for the detection of infrared radiation is the use of pyroelectric materials, capable of spontaneously changing their electric polarization as a function of temperature, as described for example by J. Fraden in "Handbook of Modern Sensors", $3^{rd}$ edition, Springer 2004. This polarization change can be detected as a current or voltage change, employing known electronic measurement circuits. Because of the difficulty of processing most pyroelectric materials, only limited numbers of photosensing elements (pixels) are fabricated on a single detector device, typically between one and several hundred pixels.

In a thermopile, larger numbers of infrared-sensitive pixels are manufactured with thermoelectric material systems, as described for example by J. Fraden in "Handbook of Modern Sensors", 3rd edition, Springer 2004. They consist of a combination of two different types of semiconductor materials, a so-called thermocouple. Due to the Seebeck effect, such a thermocouple produces a voltage as a function of a temperature difference across the device. A thermopile sensor is composed of several hundred to several thousand thermocouple pixels on the same device.

Even larger numbers of infrared pixels—up to several 100,000 pixels on a device—can be fabricated with microbolometer arrays, as described for example by J. Fraden in "Handbook of Modern Sensors", 3rd edition, Springer 2004. Each pixel consists of a thermally isolated heat absorber on top of a conducting material that shows a large resistance change as a function of temperature. Microbolometer sensors can be operated without cooling. However, because their working principle depends on device heating, the sensitivity of microbolometers is quite restricted, and it is impossible to come close to single-photon sensitivity.

This limitation can be overcome with infrared sensing devices based on the photoelectric effect, as described for example by B. E. A. Saleh and M. C. Teich, "Fundamentals of Photonics", $2^{nd}$ edition, John Wiley and Sons, 2007. In a first type of photoelectric devices, the external photoelectric effect in metals and semiconductors in a vacuum is exploited. If an incident photon of sufficient energy is absorbed by an electron in the photoelectric material, this excited electron can overcome the attractive force of the material, so that the electron can leave the material and enter the vacuum space. In the vacuum, this liberated electron can be supplied with additional energy, often by accelerating it in a high-voltage electric field, so that each individual electron can be detected reliably.

In order to simplify manufacturing of an infrared sensor and to lower the cost of production, one tries to avoid employing a vacuum. This can be accomplished with the internal photoeffect, exhibited by semiconducting material systems. These materials show a bandgap structure in their energy diagram, with a fully occupied valence band and a fully empty conduction band at zero absolute temperature. If the energy of an incident photon is larger than the bandgap—the energy difference between conduction band and valence band—then the incident photon can be absorbed by the semiconducting material and can create a pair of mobile charges, an electron in the conduction band and a hole in the valence band. In this way, incident radiation modifies the electrical conduction properties in the semiconducting material, which can be sensed with electrical circuits. In photoconductive sensors, the change of effective resistance is measured as a function of the intensity of the incident radiation. In photovoltaic sensors, the photogenerated charge pairs move in an electric field, creating an electrostatic potential change across the device as a function of the intensity of the incident radiation. The most sensitive photosensors that are based on the internal photoeffect consist of depleted semiconductor regions, created either with reverse-biased photodiodes, as used for example in CMOS image sensors, or with MOS (Metal Oxide Semiconductor) structures, as used for example in Charge Coupled Device (CCD) image sensors or photogate image sensors. In these sensitive photosensors, the devices are biased to a certain reverse potential, and then they are left electrically floating. The photogenerated charge carriers reduce the voltage across the device in proportion to the intensity of the incident radiation. This voltage change can be electrically detected with a room-temperature readout noise corresponding to less than one electron r.m.s., as described for example by Ch. Lotto and P. Seitz in European Patent No. 8,119,972 B2, "Solid state image sensing device having a low pass filter for limiting signal frequencies passing to the output node of an inverting amplifier".

All of these sensitive radiation detectors employing the external or internal photoeffect have in common that they cannot detect incident photons whose energy is too low to either overcome the effective work function in the case of the external photoeffect or to create mobile charge pairs over the bandgap in the case of the internal photoeffect. As a consequence, these sensitive photodetectors have a so-called cutoff wavelength $\lambda_C$ above which they are not sensitive any more. The cutoff wavelength $\lambda_C$ is inversely proportional to the minimum energy $E_{min}$, required to create mobile charge carriers due to the photoeffect, $\lambda_C = h \times c / E_{min}$, with Planck's constant h and the vacuum speed of light c. This implies that the photoelectric effect is unsuitable for the detection of electromagnetic radiation in the infrared spectral range with its particularly long wavelengths.

This limitation of absent infrared sensitivity can be overcome with a semiconductor device according to the HIP (homojunction internal photoemission) principle, as described for example by A. G. U. Perera et al. in "Homojunction interal photoemission far-infrared detectors: Photoresponse performance analysis", J. Appl. Phys. Vol. 77, pp. 915-924, 1995. A HIP detector consists of a vertical arrangement of a highly doped semiconductor region at the surface of the device, followed by a lightly doped (or intrinsic) region. In the highly doped region, a large number of free charge carriers are present, and these can interact with the incoming electromagnetic radiation through free carrier absorption (FCA). A free charge carrier can absorb the energy of an incident photon, resulting in a photoexcited charge carrier. These photoexcited charge carriers lose their energy rather quickly through different inelastic and elastic scattering processes over a characteristic distance L, the so-called scattering length. In a HIP device, a potential barrier is formed between the heavily and the lightly doped semiconductor region, parallel to the surface of the HIP device. If a photoexcited charge carrier is produced less than the scattering length L away from the potential barrier and if the energy of the photoexcited charge carrier is sufficiently high, then the charge carrier can overcome the potential barrier, it is transported vertically though the lightly doped region into the semiconductor, where it can be detected with one of the electronic circuits known from literature. Such HIP photosensors, made for example from silicon or germanium, have been used for the detection of infrared radiation with a wavelength exceeding 200 micrometers.

However, HIP infrared photosensors suffer from two main disadvantages: (1) The potential barrier which the excited charges must overcome is permanently fixed by the materials employed for the fabrication of the HIP photosensor; it can be determined by the work function of a particular metal, or it is governed by the doping concentration of the lightly doped semiconductor volume. As a consequence, the cutoff wavelength of such a HIP photosensor cannot be electrically adapted. (2) The incident infrared photons create excited charge carriers that must diffuse vertically through the highly-doped conversion region before reaching the lightly doped semiconductor volume where they can be detected. Since excited majority charge carriers in highly doped semiconductors have very short lifetimes before thermalization, their diffusion length in the highly doped semiconductor is limited to short distances of the order of nanometers. As a consequence, the effective quantum efficiency of such HIP photosensors is very low compared with photosensors exploiting the photoelectric effect in depleted semiconductor regions.

CITATION LIST

Patent Literature

PTL 1: European Patent No. 8,119,972 B2

Non Patent Literature

NPL 1: "Handbook of Modem Sensors", 3$^{rd}$ edition, J. Fraden, Springer 2004
NPL 2: "Fundamentals of Photonics", 2$^{nd}$ edition, B. E. A. Saleh and M. C. Teich, John Wiley and Sons, 2007
NPL 3: "Homojunction interal photoemission far-infrared detectors: Photoresponse performance analysis", J. Appl. Phys. Vol. 77, pp. 915-924, 1995

SUMMARY OF INVENTION

Technical Problem

To overcome the limitations of these known methods and devices, the present invention describes a semiconductor photosensor device for infrared radiation in the wavelength range of 1 to 1000 micrometers, making use of free carrier absorption in a highly doped semiconductor volume. The cutoff-wavelength of the infrared photosensor according to the present invention can be adapted arbitrarily through selection of a voltage on a gate electrode. Transport of excited charge carriers occurs laterally, leading to an enhanced quantum efficiency compared to conventional HIP infrared photosensors.

The present invention overcomes the above described limitations of infrared photosensors by providing a photosensor device for the sensitive detection of infrared radiation in the wavelength range of 1 to 1000 micrometers. It consists of a semiconductor substrate with a highly doped interaction volume for the incident infrared radiation. At the edge of this highly doped region, an extended gate electrode is placed consisting of a conducting material on top of an insulating layer. On the other side of the gate electrode, another highly doped semiconductor region is placed, acting as a charge collector. Through free charge carrier absorption in the interaction volume, incoming infrared photons impart their energy on mobile charge carriers. If the mobile charge carriers are free electrons, the gate electrode is biased slightly below the reset voltage of the interaction volume, so that the electrons carrying the additional energy of the absorbed photons can predominantly make the transition from the interaction volume across the gate electrode area to the charge collector volume, whose potential has been set sufficiently high so that the collected free electrons remain in this semiconductor region. The collected free charge carriers are electronically detected with known circuits for the measurement of electric current or charge packets. A multitude of such photosensor devices can be arranged in one- or two-dimensional arrays to form line or area sensors for infrared radiation.

Solution to Problem

An aspect of the present invention relates to a photosensor for detecting infrared radiation in the wavelength range of 1 to 1000 micrometers. The photosensor comprises a main region of a semiconductor substrate; a highly doped interaction volume for the incoming radiation in the semiconductor substrate; an adjacent gate electrode including a conducting material on top of an insulated layer, the adjacent gate electrode being an extended structure adjacent to the interaction volume; and an adjoining highly doped collector region acting as a charge collector, the collector region essentially consisting of a highly doped semiconductor zone and being an extended structure adjacent to the gate electrode. In the photosensor, the interaction volume is electrically biased to a first voltage $V_B$, the collector region is electrically biased to a second voltage $V_S$, which is higher than the first voltage $V_B$ in case photo-excited electrons should be collected, and which is lower than the first voltage in case photo-excited holes should be collected, the incoming photons impart their energy through free carrier absorption on mobile charge carriers in the interaction volume, producing photo-excited electrons in case the free charge carriers are electrons, or producing photo-excited holes in case the free charge carriers are holes, and the gate electrode is biased to a third voltage $V_G$, so that a potential barrier for the photo-excited charge carriers in the interaction volume is created, such that the energy imparted by the incoming photons is sufficient for the photo-excited charge carriers to overcome the potential barrier, and the photo-excited charge carriers can be collected in the collector region for subsequent electronic detection.

In the above photosensor, a region of the interaction volume may be bordered on at least one side by the gate electrode and the collector region. The collector region may be surrounded by the gate electrode which is surrounded by a region of the interaction volume. The collector region may have a rectangular structure, a circular structure or a polygonal structure.

The above photosensor may further comprise an amplifier or circuit that is connected to the collector region, the amplifier or circuit sensing the second voltage $V_S$ and producing an output voltage $V_{out}$. The amplifier or circuit may include a reset switch that resets the collector region to the second voltage $V_S$. The reset switch may periodically reset the collector region. The amplifier or circuit may include a sense node and a source-follower transistor, the sense node being reset to the second voltage $V_S$ by the reset switch and being connected to a gate of the source-follower transistor.

Advantageous Effects of Invention

This invention may provide a photosensor for the highly sensitive detection of infrared radiation over a wide, adaptable spectral range.

BRIEF DESCRIPTION OF DRAWINGS

The invention will be better understood, and objects other than those set forth above will become apparent when consideration is given to the following detailed description thereof. Such description makes reference to the annexed drawings, wherein.

DESCRIPTION OF EMBODIMENTS

It is a principle object of the invention to provide a photosensor for the highly sensitive detection of infrared radiation in the wide spectral range from 1 to 1000 micrometers.

A further object of the invention is to provide an infrared photosensor that can be fabricated with industry-standard semiconductor processes such as the widely available silicon-based CMOS processes.

Another object of the invention is to provide an infrared photosensor whose cutoff wavelength can be chosen fast and adaptively with a voltage.

Yet another object of the invention is to provide an infrared photosensor device with such a small footprint that one- and two-dimensional infrared image sensors can be created using industry-standard semiconductor processes, resulting for example in an infrared image sensor with at least one Megapixels per square centimeter.

A final object of the invention is to provide a photosensor device that can distinguish between photocurrents generated by incident infrared photons and currents that are generated either through thermal excitation (so-called dark currents) or photocurrents generated by incident visible photons. This distinction is made through proper electrical operation of the device, without the need of additional optical filters.

Figure 1:
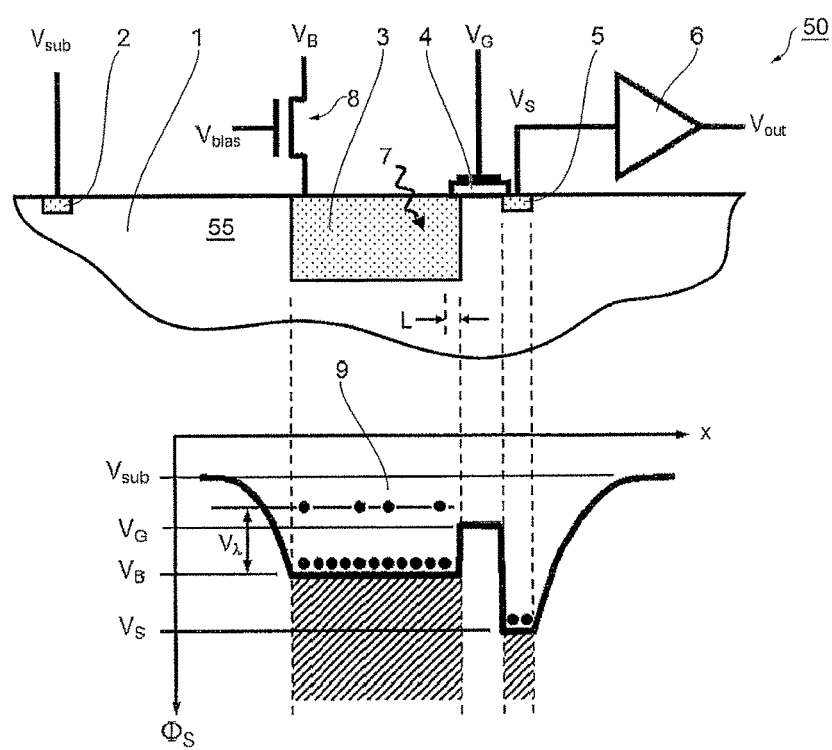
FIG. 1 shows a cross section of the infrared photosensor according to the present invention. In the lower part of the figure, the lateral distribution of the surface potential $\Phi_S$ (the electrostatic potential at the surface of the semiconductor) is shown for the case where the free charge carriers in the interaction region are electrons, and where the potential $V_\lambda$ of the incident infrared photons is larger than the gate potential difference $V_B$-$V_G$.

With the foregoing objects in view, the present invention is achieved with a semiconductor device illustrated in FIG. 1. It consists of lightly doped or intrinsic semiconductor substrate 55 (main region 1) that is biased to substrate voltage $V_{sub}$ through highly doped contact region 2. In substrate 55, interaction volume 3 is fabricated as highly doped semiconductor volume of the opposite type as the main region 1 of the substrate 55. Interaction volume 3 can be reset to a bias potential $V_B$ through bias switch 8. Adjacent to interaction volume 3, extended gate electrode 4 is placed, consisting of a conducting layer on top of which an insulating layer is fabricated. Gate electrode 4 is connected to the gate voltage $V_G$. On the other side of gate electrode 4, collector region 5 is fabricated as a highly doped semiconductor region of the same type as interaction volume 3. Collector region 5 is connected to amplifier 6 (amplifier circuit), sensing the signal potential $V_S$ and producing the output voltage $V_{out}$. Incident photons 7 interact with the free charge carriers in interaction volume 3, imparting their energy to free charge carriers and exciting them into a higher energy state.

Without loss of generality, it is assumed in the following that the free charge carriers are electrons, in which case interaction volume 3 and collector volume 5 are of n+ type and main region 1 of the substrate 55 is either of p− type or intrinsic. Interaction volume 3 is biased through switch 8 to the intermediate bias voltage $V_B$. The substrate voltage $V_{sub}$ is adjusted such that no net current flows between interaction volume 3 and main region 1 of the substrate 55. The gate voltage $V_G$ is selected lower than the bias voltage $V_B$, such that an electrostatic barrier with a potential difference of $(V_B-V_G)$ is created for the free electrons in interaction volume 3. Due to thermal excitation of the free electrons in interaction volume 3, some of these thermally excited electrons have sufficient energy to overcome the potential barrier, so that they can diffuse through gate region 4 and be collected in collector region 5.

Collector region 5 is biased to a high positive voltage $V_S$, to prevent collected electrons from returning to interaction region 3. Free electrons that overcome the potential barrier due to thermal excitation represent the temperature-dependent dark current of the photosensor according to the present invention.

Incident photons interact in interaction region 3 with the free electrons due to the free carrier absorption (FCA) effect, as described for example by P. Y. Yu and M. Cardona in "Fundamentals of Semiconductors", $4^{th}$ Ed., Springer, 2010. The absorption coefficient due to the FCA is proportional to the doping concentration of the interaction region and to the square of the wavelength of the incident photons. In doped semiconductors, absorption of electromagnetic radiation is dominated by FCA above the cutoff-wavelength. In heavily doped silicon, FCA is the dominating absorption mechanism in the wavelength range from 1.1 micrometers to at least 1000 micrometers. When an incident photon of wavelength λ interacts with a free electron through FCA, the photon imparts its energy E=h×c/λ to the free electron. This corresponds to an excited energy state of the electron with a potential difference of $V_\lambda=E/q=h\times c/(\lambda \times q)$ in the potential diagram of FIG. 1, q denoting the unit charge q=1.602×10⁻¹⁹ As.

If this potential difference $V_\lambda$ is at least as high as the potential barrier $(V_B-V_G)$ created by the gate electrode, then the excited electron can overcome the potential barrier, it can diffuse through the gate region, and it is then collected in collection region 5 where it contributes to the signal charge. In this mode of operation, the photocurrent is effectively independent of the gate voltage $V_G$ as long as $V_\lambda$ is larger than the potential barrier $(V_B-V_G)$. This is the preferred mode of operation if the device is cooled to such low temperatures that the dark current density is comparable to or smaller than the photocurrent.

Figure 2:
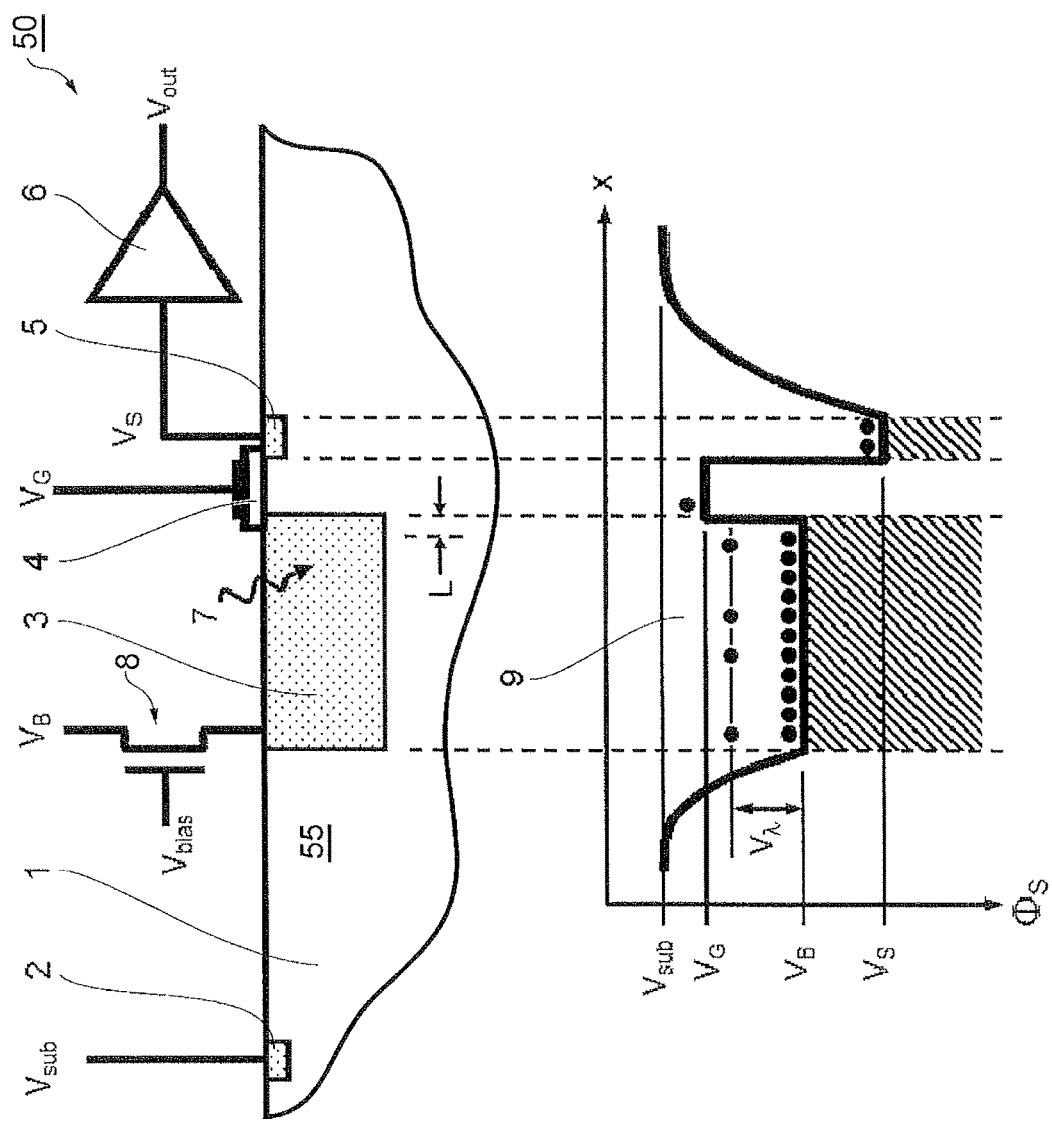
FIG. 2 shows a cross section of the infrared photosensor according to the present invention. In the lower part of the figure, the lateral distribution of the surface potential $\Phi_S$ (the electrostatic potential at the surface of the semiconductor) is shown for the case where the free charge carriers in the interaction region are electrons, and where the potential $V_\lambda$ of the incident infrared photons is lower than the gate potential difference $V_B$-$V_G$.

The device can also be operated with little or no cooling, and its mode of operation for this case is illustrated in FIG. 2: The potential $V_\lambda$ of the photo-excited electrons is lower than the potential barrier $(V_B-V_G)$. In this case, free electrons contributing to the dark current as well as to the photocurrent must be thermally excited to overcome the potential barrier represented by $(V_B-V_G)$. For this reason, the total photocurrent $I_P$ is given as the sum of three components, dark current $I_d$, plus photocurrent $I_v$ generated by incident photons with an energy below the cutoff wavelength of the semiconductor, plus the signal photocurrent $I_s$ generated by incident infrared photons: $I_P=I_d+I_v+I_s$. Because both currents $I_d$ and $I_s$ are dependent on thermal excitation for the electrons to overcome the potential barriers, they are proportional to each other, i.e. $I_s=A(\lambda)\times P_{IR}\times I_d$, with the intensity $P_{IR}$ of the incident infrared radiation and the proportionality constant $A(\lambda)$ depending on the wavelength λ of the incident infrared photons. While both currents $I_d$ and $I_s$ depend exponentially on the gate voltage difference $(V_B-V_G)$, the photocurrent $I_v$, does not depend on it. For this reason, it is possible to determine $I_v$, as the contribution to the total device current that is independent of the gate voltage, by measuring the total current for two or more different gate voltages and by calculating the constant part in the current. Therefore, the share of incident radiation whose wavelength is below the cutoff-wavelength of the semiconductor can be measured without the need of any additional optical filters.

In any case, the raw output signal of amplifier 6 consists of the sum of signal currents plus temperature-dependent dark current. The net signal is obtained by determining the difference between raw output signal and the contribution from the dark current. One preferred way to determine the dark current is to provide an additional photosensor according to the present invention as a reference device, whose surface is completely covered with a material that is opaque to the incident electromagnetic radiation. For this reason, the total current measured by this device is only due to dark current, and if the temperature of the reference device is the same as the uncovered measurement device, then the dark current in the measurement device is also known.

Figure 3:
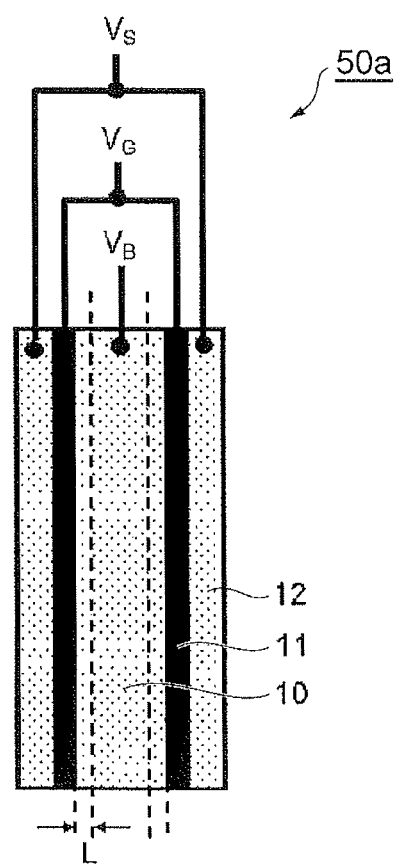
FIG. 3 shows the top view of a preferred embodiment of the infrared photosensor according to the present invention. It consists of a linear arrangement of highly doped interaction volume, bordered on both sides by collector structures.

The de-excitation (relaxation) time of free charge carriers in highly doped semiconductors is very small; in silicon it is of the order of 1 ps. As a consequence, there exists a scattering length L over which an excited charge carrier loses its photo-excitation energy; in silicon this scattering length in highly doped silicon is of the order of 1 nm. Only free electrons that interacted with incident photons less than a distance of L away from the gate electrode have a chance to overcome the potential barrier. This is illustrated in FIGS. 1 and 2. It is therefore desirable to make the width of the interaction regions as small as possible to obtain a high quantum efficiency of the resulting photosensor. Preferred embodiments of the infrared photosensor according to the present invention are illustrated in FIGS. 3, 4 and 5:

In FIG. 3, a strip-like arrangement of the photosensor 50a is shown, with long and thin interaction region 10, bordered on both sides by gate electrode 11 and collection region 12. As illustrated in the figure, the inner part of the interaction region 10, which is more than a distance L away from the gate electrodes 11, does not contribute to the photosignal, and it is essentially inactive in our photosensor.

Figure 4:
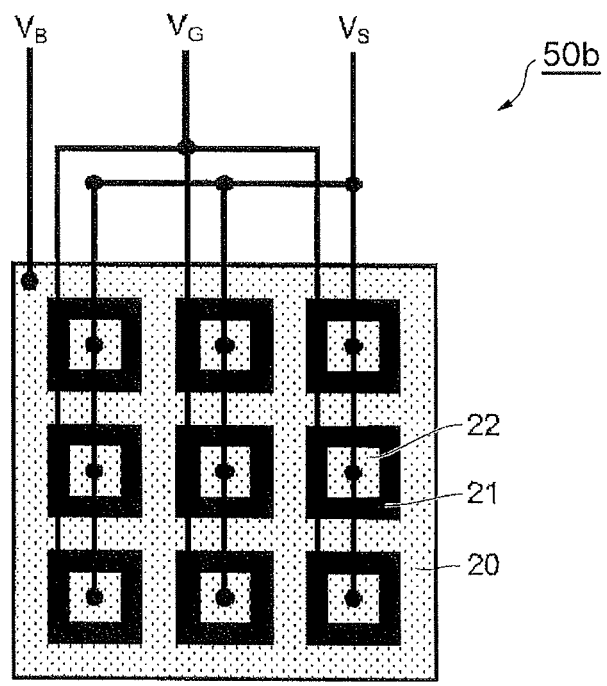
FIG. 4 shows the top view of another preferred embodiment of the infrared photosensor according to the present invention. It consists of a two-dimensional array of rectangular collector structures in a highly doped interaction volume.

In FIG. 4, the photosensor 50b with a two-dimensional array of small rectangular collection regions 22 surrounded by gate electrodes 21 in larger interaction region 20 is shown. The signals from all collection regions 22 are added, so that photosensors with arbitrary area can be realized without loss in sensitivity.

Figure 5:
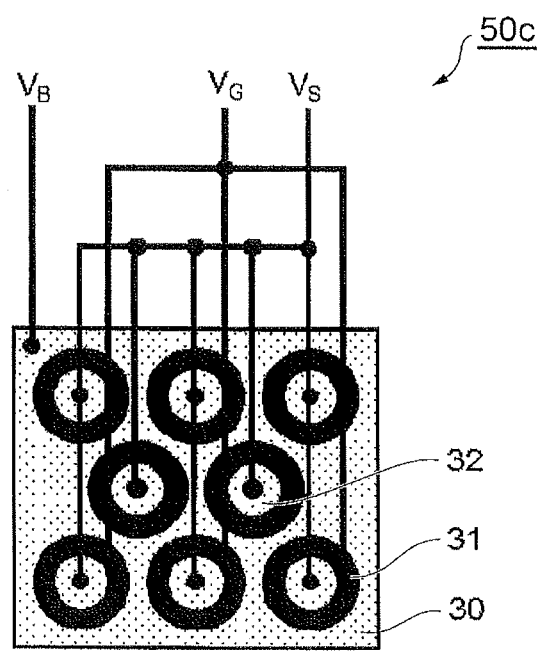
FIG. 5 shows the top view of another preferred embodiment of the infrared photosensor according to the present invention. It consists of a two-dimensional array of circular collector structures in a highly doped interaction volume.

As illustrated in FIG. 5, the photosensor 50c with the small collection regions 32 surrounded by gate electrodes 31 can alternatively be realized as circular structures. This embodiment provides for constant electric field conditions around the circumference of the gate electrodes, preventing any high-field regions at corners.

Figure 6:
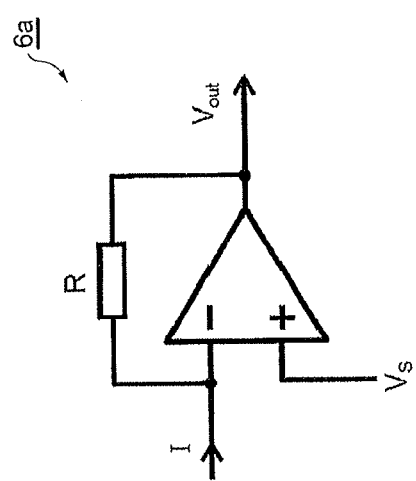
FIG. 6 shows an example circuit for the continuous readout of current from the collector structure. It consists of a transimpedance amplifier, converting incoming current into a signal voltage.

Free charge carriers accumulated in the collection regions are detected with known electronic circuits. Preferred embodiments of amplifier circuit 6 symbolically shown in FIGS. 1 and 2 are illustrated in FIGS. 6-10:

FIG. 6 shows a transimpedance amplifier circuit 6a employed for the continuous measurement of current I provided by the collection region connected to the input of this circuit. This transimpedance amplifier circuit 6a keeps the collection region at potential $V_S$, and at its output it yields a voltage $V_{out}$=R·I that is proportional to the input current I, where R is the resistance in the feedback loop.

Figure 7:
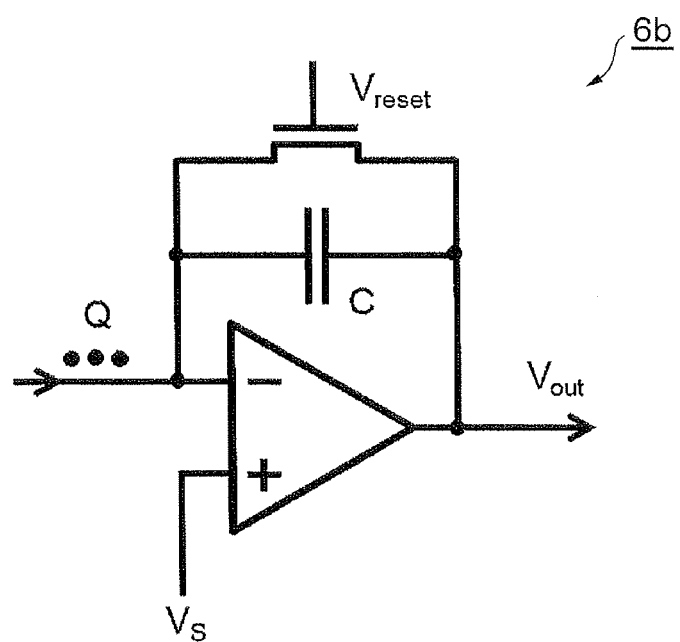
FIG. 7 shows an example circuit for the readout of charge carriers in the collector structure. It consists of a charge integrator with reset switch.

FIG. 7 shows a charge integrator circuit 6b, capable of integrating the charge Q accumulated in the collector region. Integration takes place on the capacitance C in the feedback loop of the operational amplifier, yielding an output voltage of $V_{out}$=Q/C. Once an integration period has finished, the output voltage is read out by an external circuit, and the charge integrator circuit is reset by closing the reset switch in the feedback loop with the $V_{reset}$ signal. In this way, the collector region is periodically reset to the potential $V_S$.

Figure 8:
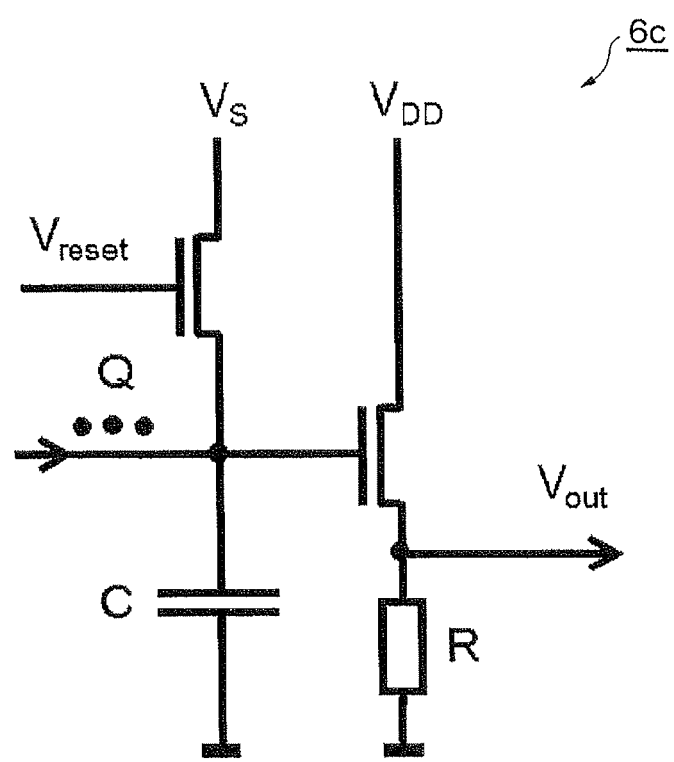
FIG. 8 shows another example circuit for the readout of charge carriers in the collector structure. It consists of a source follower with a reset switch connected to the sense node.

FIG. 8 shows a source follower circuit 6c, capable of measuring the charge Q accumulated in the collector region with high sensitivity. Charge integration takes place on the capacitance C connected to the sense node. Before charge integration starts, the sense node is reset to the potential $V_S$ by closing the reset switch connected to the sense node with the $V_{reset}$ signal. Integrating the charge Q on capacitance C results in a voltage signal given by V=Q/C on the sense node, which is electrically connected with the gate of the source-follower transistor. The source of the source-follower transistor is connected through a resistor R to ground potential, and the drain is connected to the power supply voltage $V_{DD}$. At the output of the source-follower circuit, a voltage $V_{out}$ is produced, which is essentially the same as the gate voltage minus an offset voltage $V_T$, i.e. $V_{out} \cong Q/C - V_T$.

Figure 9:
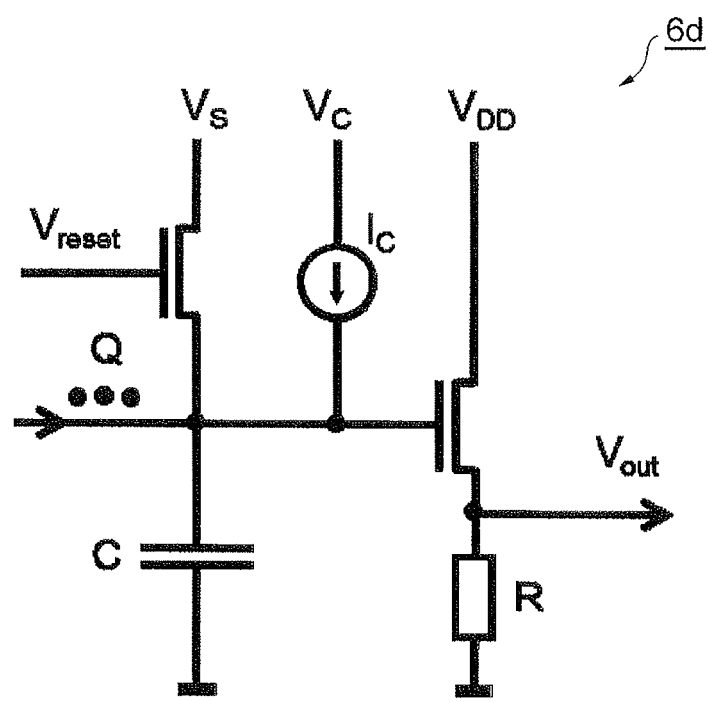
FIG. 9 shows an example circuit for the readout of charge carriers in the collector structure, offering increased dynamic range. It consists of a source follower with a reset switch connected to the sense node, and a current source connected also to the sense node, through which a programmable compensation current $I_C$ can flow

FIG. 9 shows the schematic diagram of an electronic circuit 6d offering an increased dynamic range of the current measurement, based on the source-follower circuit shown in FIG. 8. Such an increased dynamic range is desirable in cases where the dark current represents a significant fraction of the total current measured with the photosensor device according to the present invention. This increased dynamic range can be accomplished with a programmable current source in series with the photosensor device. In this way, a compensation current $I_C$ can be subtracted from the total current measured with the device. If this compensation current is close to the dark current, the influence of the dark current on the net signal current is significantly reduced, and hence the dynamic measurement range of the device is correspondingly increased.

Figure 10:
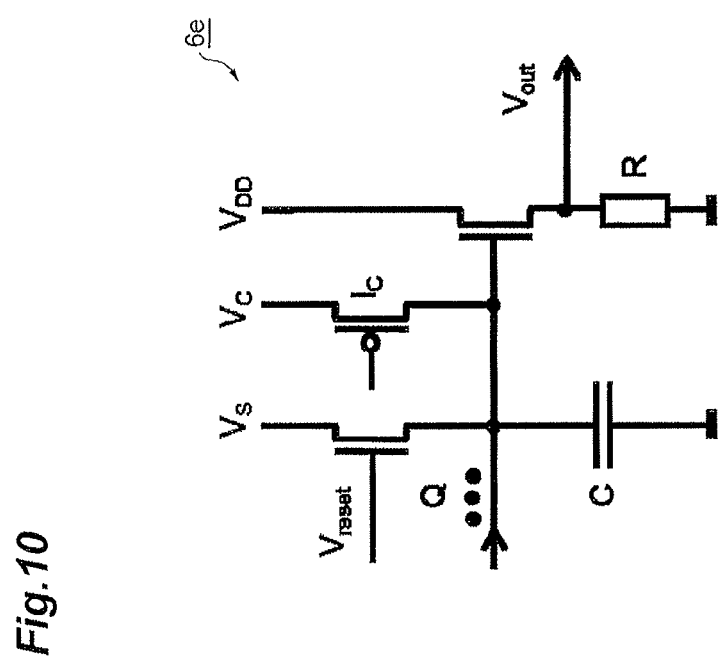
FIG. 10 shows a preferred embodiment of the circuit in FIG. 9 for the readout of charge carriers in the collector structure, offering increased dynamic range. It consists of a source follower with a reset switch connected to the sense node, and a single transistor operated in saturation mode as a current source, connected also to the sense node. This transistor acts as the programmable current source through which the compensation current $I_C$ can flow

FIG. 10 shows a preferred embodiment of the circuit 6e with increased dynamic range depicted schematically in FIG. 9. The programmable current source is implemented with a single transistor operated in saturation mode, i.e., the current through this transistor is essentially independent of the source-drain voltage, and the compensation current $I_C$ can be programmed with the gate voltage.

The infrared photosensor according to this invention can be implemented with commercially available semiconductor processes, as a photosensitive structure with dimensions in the micrometer range, similar in size to the photosensitive regions in known silicon-based photosensors for the visible and near infrared spectral range. Preferred embodiments of the charge detection circuits for the infrared photosensor according to this invention are also very similar to the photocharge detection circuits employed in known silicon-based photosensors for the visible and near infrared spectral range. As a consequence, a complete infrared photosensor according to this invention has a comparable footprint as known pixels of silicon-based photosensors for the visible and near infrared spectral range. For this reason, it is possible to fabricate multitudes of infrared photosensors according to this invention on the same piece of semiconductor. In particular, one-dimensional infrared line sensors and two-dimensional infrared image sensors can be fabricated with pixel densities that are comparable to the ones obtained for silicon-based line and image photosensors for the visible and near infrared spectral range.

As describe above, the photosensor according to this invention includes a main region of a semiconductor substrate, a highly doped interaction volume for the incoming radiation in the semiconductor substrate, an adjacent gate electrode including a conducting material on top of an insulated layer, the adjacent gate electrode being an extended structure adjacent to the interaction volume, and an adjoining highly doped collector region acting as a charge collector, the collector region essentially consisting of a highly doped semiconductor zone and being an extended structure adjacent to the gate electrode. The interaction volume is electrically biased to a first voltage $V_B$, the collector region is electrically biased to a second voltage $V_S$, which is higher than the first voltage $V_B$ in case photo-excited electrons should be collected, and which is lower than the first voltage $V_B$ in case photo-excited holes should be collected. The incoming photons impart their energy through free carrier absorption on mobile charge carriers in the interaction volume, producing photo-excited electrons in case the free charge carriers are electrons, or producing photo-excited holes in case the free charge carriers are holes. The gate electrode is biased to a third voltage $V_G$, so that a potential barrier for the photo-excited charge carriers in the interaction volume is created, such that the energy imparted by the incoming photons is sufficient for the photo-excited charge carriers to overcome the potential barrier, and the photo-excited charge carriers can be collected in the collector region for subsequent electronic detection.

In a preferred embodiment, the infrared photosensor according to the present invention can be fabricated with silicon as a base material, making use of the fabrication methods employed for CMOS devices.

REFERENCE SIGNS LIST

1 . . . substrate, 2 . . . contact region, 3 . . . interaction volume, 4 . . . gate electrode, 5 . . . collector region, 6 . . . amplifier, 7 . . . incident photon, 8 . . . switch, 50, 50a, 50b, 50c. photosensor, 55 . . . semiconductor substrate.

The invention claimed is:

1. A photosensor for detecting infrared radiation in the wavelength range of 1 to 1000 micrometers, comprising:
   a main region of a semiconductor substrate;
   a highly doped interaction volume comprising a doping level of greater than $10^{18}$ cm$^{-3}$ and free charge carriers that interact with the incoming radiation in the semiconductor substrate through free carrier absorption;
   an adjacent gate electrode including a conducting material on top of an insulated layer, the adjacent gate electrode being an extended structure adjacent to the interaction volume; and
   an adjoining highly doped collector region acting as a charge collector, the collector region essentially consisting of a highly doped semiconductor zone with a doping level of greater than $10^{18}$ cm$^{-3}$ and being an extended structure adjacent to the gate electrode,
   wherein the interaction volume is electrically biased to a first voltage $V_B$,
   the collector region is electrically biased to a second voltage $V_S$, which is higher than the first voltage $V_B$ in case photo-excited electrons should be collected, and which is lower than the first voltage $V_B$ in case photo-excited holes should be collected, the incoming photons impart their energy through free carrier absorption on mobile charge carriers in the interaction volume, producing photo-excited electrons in case the free charge carriers are electrons, or producing photo-excited holes in case the free charge carriers are holes, the gate electrode is biased to a third voltage $V_G$, so that a potential barrier for the photo-excited charge carriers in the interaction volume is created, such that the energy imparted by the incoming photons is sufficient for the photo-excited charge carriers to overcome the potential barrier, and the photo-excited charge carriers can be collected in the collector region for subsequent electronic detection, and the photosensor is capable of detecting infrared radiation in an entirety of the wavelength range of 1 to 1000 micrometers.

2. The photosensor according to claim 1, wherein a region of the interaction volume is bordered on at least one side by the gate electrode and the collector region.

3. The photosensor according to claim 1, wherein the collector region is surrounded by the gate electrode which is surrounded by a region of the interaction volume.

4. The photosensor according to claim 3, wherein the collector region has a rectangular structure, a circular structure or a polygonal structure.

5. The photosensor according to claim 1, further comprising;

an amplifier or circuit that is connected to the collector region, the amplifier or circuit sensing the second voltage $V_S$ and producing an output voltage $V_{out}$.

6. The photosensor according to claim 5, wherein the amplifier or circuit includes a reset switch that resets the collector region to the second voltage $V_S$.

7. The photosensor according to claim 6, wherein the reset switch periodically resets the collector region.

8. The photosensor according to claim 5, wherein the amplifier or circuit includes a sense node and a source-follower transistor, the sense node being reset to the second voltage $V_S$ by the reset switch and being connected to a gate of the source-follower transistor.

9. The photosensor according to claim 8, wherein the sense node is connected to a programmable current source, with which an offset current can be subtracted from the signal current accumulated by the collector region, wherein this programmable current source provides for increased dynamic range of the photo sensor, since a substantial part of the dark current can be subtracted from the signal current before its electronic detection.

10. The photosensor according to claim 1, wherein the photosensor is a three-terminal device.

11. The photosensor according to claim 1, wherein the photosensor is a Complementary Metal Oxide Semiconductor (CMOS) image sensor.

12. The photosensor according to claim 1, wherein no more than three voltages are selected in operation.

* * * * *